United States Patent [19]

Kobayashi et al.

[11] Patent Number: 5,532,621
[45] Date of Patent: Jul. 2, 1996

[54] OUTPUT BUFFER CIRCUIT, INPUT BUFFER CIRCUIT AND BI-DIRECTIONAL BUFFER CIRCUIT FOR PLURAL VOLTAGE SYSTEMS

[75] Inventors: Kenichiro Kobayashi; Hisaya Keida, both of Chiba, Japan

[73] Assignee: Kawasaki Steel Corporation, Hyogo, Japan

[21] Appl. No.: 360,056

[22] Filed: Dec. 20, 1994

[30] Foreign Application Priority Data

Dec. 24, 1993 [JP] Japan .................................. 5-327156

[51] Int. Cl.⁶ .................. H03K 19/094; H03K 17/06
[52] U.S. Cl. .................. 326/86; 326/87; 326/81; 326/58; 326/68
[58] Field of Search .................. 326/80, 81, 86, 326/87, 58, 30, 36, 68

[56] References Cited

U.S. PATENT DOCUMENTS

| | | | |
|---|---|---|---|
| 4,217,502 | 8/1980 | Suzuki et al. | 326/87 |
| 4,324,991 | 4/1982 | Tamaki | 326/21 |
| 4,438,352 | 3/1984 | Mardkha | 326/86 |
| 4,800,303 | 1/1989 | Graham et al. | 326/86 |
| 4,853,560 | 8/1989 | Iwamura et al. | 326/86 |
| 4,890,051 | 12/1989 | Kim et al. | 323/313 |
| 4,978,905 | 12/1990 | Hoff et al. | 323/314 |
| 5,128,560 | 7/1992 | Chern et al. | 326/81 |
| 5,321,319 | 6/1994 | Mahmood | 326/21 |

FOREIGN PATENT DOCUMENTS

| | | |
|---|---|---|
| 4-290008 | 10/1992 | Japan . |
| 2272120 | 5/1994 | United Kingdom . |

*Primary Examiner*—Edward P. Westin
*Assistant Examiner*—Richard Roseen
*Attorney, Agent, or Firm*—Oliff & Berridge

[57] ABSTRACT

Bi-directional buffer circuit comprises a second P-channel transistor whose back gate is connected to a pad, a third P-channel transistor disposed between a gate of the second P-channel transistor and the pad with its back gate connected to the pad, and a first N-channel transistor and a fifth N-channel transistor whose gates are connected to a power source, so that an output buffer circuit, an input buffer circuit and a bi-directional buffer circuit can be produced without necessity of any additional processing step, wherein merely a single power source is incorporated, and a voltage higher than the source voltage is permitted to be applied to a common bus.

18 Claims, 9 Drawing Sheets

5,532,621

OUTPUT BUFFER CIRCUIT, INPUT BUFFER CIRCUIT AND BI-DIRECTIONAL BUFFER CIRCUIT FOR PLURAL VOLTAGE SYSTEMS

BACKGROUND OF THE INVENTION

1. Field of the Invention

The present invention relates to a semiconductor integrated circuit operable under circumstances where a plurality of supply voltages are coexistent, as in an instance where the integrated circuit is mounted on a board which is so designed as to operate with a power source including a plurality of supply voltages, and/or bearable against live disconnection.

2. Description of the Prior Art

In respect of designing a circuit board, there is recently adopted a technique of reducing a supply voltage to, e.g., 3 V for some partial devices while applying 5 V to operate the other devices. In most cases, the reason is based on an attempt to realize suppression of the entire power consumption or on the specification that the rated supply voltage for some partial devices is lower than 5 V. Under such circumstances where mutually different supply voltages are coexistent for the individual operations, there may arise a problem that, when a signal is fed from a 5 V device to a lower-voltage device or the devices operated at mutually different voltages are connected to the same bus, a current flows from the 5 V device to the lower-voltage device. Such an undesired current flow may cause considerable disadvantages including an increase of the power consumption, latch-up of the devices and, due particularly to the voltage of 5 V, breakdown of transistors in the latest miniaturized high-density devices.

FIG. 9 typically shows how a 3 V-operated device and a 5 V-operated device are coexistent on a board while being connected to a common bus, and FIG. 10 is a schematic circuit diagram of a known conventional bi-directional buffer circuit enclosed with a circle in FIG. 9.

When a 3 V device and a 5 V device are connected to a common bus as shown in FIG. 9, there arise the following problems (1) to (3) in the circuit of FIG. 10.
(1) Upon input of 5 V from an external bus 10 via a pad 11, a parasitic diode 12a for a P-channel transistor 12 in the final output stage is turned on to consequently form a current path (1), whereby a great leakage current is caused to flow therethrough.
(2) Since merely 3 V is applied to the gate of the P-channel transistor 12, this transistor 12 fails to be completely turned off and is therefore placed in a weak on-state, so that a current path (2) is formed therein also.
(3) As 5 V is applied to both an N-channel transistor 13 in the final output stage and an N-channel transistor 14 in the initial input stage, a high electric field is generated to eventually arouse some problems relative to the withstand voltage of gate oxide films, hot carriers and so forth, whereby the N-channel transistors 13 and 14 may be broken down.

FIG. 11 typically shows conventional means contrived for solving the problems mentioned above. In this diagram, there is included merely its output buffer circuit alone.

For the purpose of preventing a leakage current when the supply voltage is 5 V with regard to the bus 10 on the board, 5 V is applied to the final output stage. Further, the oxide film of the transistor only in the final output stage is processed to be thicker so that this transistor may not be deteriorated even if 5 V is applied to the final output stage.

In addition to such countermeasures, a level shift circuit for converting a 3 V signal into a 5 V one is incorporated to achieve complete turn-off of the P-channel transistor in the final output stage, wherein a 3 V signal in a 3 V system circuit is converted into a 5 V signal, which is then supplied to the gate of the P-channel transistor in the final output stage.

As a result of the means mentioned, there is contrived an improved circuit system where both a 3 V-operated device and a 5 V-operated device are rendered connectable to the common bus 10.

However, for effecting the measures shown in FIG. 11, it is unavoidable that some processing steps are increased inclusive of forming a thicker oxide film only partially, and a longer time is required for manufacture of a chip to eventually bring about a rise of the production cost.

Furthermore, it becomes necessary to supply voltages of two systems, i.e., 3 V and 5 V, to the devices to consequently induce additional complication of the wiring on the board with a disadvantageous increase in the number of required pins on the chip.

In Japanese Patent Laid-open No. Hei 4 (1992)-290008, there is disclosed an off-chip driver circuit which comprises a single pull-up transistor; an output terminal; a voltage source for providing a supply voltage of a predetermined value in an arrangement where the pull-up transistor is disposed between the voltage source and the output terminal; a control transistor connected between the gate electrode of the pull-up transistor and the output terminal, and having a gate electrode connected to a first reference potential point; a bus gate; a predriver circuit coupled via the bus gate to the gate electrode of the pull-up transistor; and means for selectively applying to the output terminal a voltage considerably higher than the aforesaid supply voltage of a predetermined value.

However, this known driver circuit also has some disadvantages that, since the substrate (back gate) of the pull-up transistor is biased from the power source via the control transistor, the back gate resistance is rendered high and therefore a latch-up problem is prone to be raised.

Further, when a partial circuit board is inserted into and/or extracted from a connector of a main system without cutting power supply thereof, voltage may be applied to the pad without supplying voltage to the output buffer circuit due to disconnection of the connector. Also in this live disconnection case, the same current paths (1) (2) as shown in FIG. 10 cause in prior art output buffer circuit. So, there is a problem in a reliability.

More specifically, when "H" is inputted to the pad 11 through connector pin under the condition that power supply 3 V to the last stage transistor 12 is cut down (off) to 0 V, currents (1) (2) as shown in FIG. 10 flow within transistor 12 so that parasitic diode 12a and then transistor 12 turned on.

SUMMARY OF THE INVENTION

It is therefore an object of the present invention to provide an output buffer circuit, an input buffer circuit and a bi-directional buffer circuit producible without the necessity of any additional processing step, wherein merely a single power source is incorporated and there is permitted the application of a voltage higher than that the single power source to a common bus.

Another object of the present invention resides in providing an output buffer circuit operable at a high AC speed.

And a further object of the present invention is to provide an output buffer circuit having superior resistance against occurrence of a latch-up trouble.

A further object of the present invention is to provide an output buffer circuit bearable against the live disconnection, which can prevent the current paths (1) (2) when the partial circuit board is inserted into and/or extracted from the connector of the main system.

For the purpose of achieving the objects mentioned above, the output buffer circuit of the present invention for outputting a signal to a pad via which the signal is transferred to an external circuit, comprises:

first and second pull-up transistors connected in series between a power source and the pad, wherein a first signal is inputted to a gate of the first pull-up transistor disposed proximate to the power source, and a back gate of the second pull-up transistor disposed proximate to the pad is connected to said pad; and a gate pull-up transistor for pulling up a gate of the second pull-up transistor.

In the output buffer circuit of the present invention, the pad may be connected to a connector for inserting and/or extracting the partial circuit board into or from the main system.

For the purpose of achieving the objects mentioned above, the output buffer circuit of the present invention for outputting an "H" (high) level, an "L" (low) level or a high impedance to a pad, via which a signal is transferred from or to an external circuit, comprises:

(1-1) a successive series connection of a first P-channel transistor and a second P-channel transistor between the power source and the pad in this order, wherein a back gate of the first P-channel transistor is connected to the power source and a gate thereof is connected to a first signal input terminal to which a first signal is inputted, the first signal being transited to an "L" level at the time of outputting an "H" level to the pad, or transited to an "H" level at the time of outputting an "L" level or a high impedance to the pad, and a back gate of the second P-channel transistor is connected to the pad;

(1-2) a successive series connection of a first N-channel transistor and a second N-channel transistor between the pad and the ground in this order, wherein a gate of the first N-channel transistor is connected to the power source or the first signal input terminal, and a gate of the second N-channel transistor is connected to a second signal input terminal to which a second signal is inputted, the second signal being transited to an "L" level at the time of outputting an "H" level or a high impedance to the pad, or transited to an "H" level at the time of outputting an "L" level to the pad;

(1-3) a successive series connection of a third N-channel transistor and a fourth N-channel transistor between the first signal input terminal and the gate of the second P-channel transistor in this order, wherein a gate of the third N-channel transistor is connected to an enable signal input terminal to which an enable signal is inputted, the enable signal being transited to an "H" level at the time of outputting an "H" level or an "L" level to the pad, or transited to an "L" level at the time of outputting a high impedance to the pad, and a gate of the fourth N-channel transistor is connected to either the power source or a third signal input terminal to which a third signal is inputted, the third signal having an inverted logic with respect to the second signal; and (1-4) a third P-channel transistor connected between the pad and the gate of the second P-channel transistor, wherein a back gate of the third P-channel transistor is connected to the pad, and a gate thereof is connected to either the power source or the third signal input terminal.

Also for the purpose of achieving the aforementioned objects, the input buffer circuit of the present invention for receiving an "H" level or an "L" level from an external circuit to an internal circuit through a pad, via which a signal is transferred from or to the external circuit, comprises:

(2-1) an inverter;

(2-2) a fifth N-channel transistor disposed between the pad and the input terminal of the inverter with its gate connected to the power source; and (2-3) a feedback circuit for raising the input terminal potential of the inverter to the power source potential at the time of inputting an "H" level to the pad.

Further the bi-directional buffer circuit of the present invention comprises an output buffer circuit consisting of the aforesaid elements (1-1) to (1-4) and an input buffer circuit consisting of the aforesaid elements (2-1) to (2-3), wherein the output and input buffer circuits are connected to the same pad.

In the buffer circuit of the present invention, mutual connection between the gate of each transistor and the power source or the ground may be either direct or indirect through an impedance element such as a resistor.

In the output buffer circuit of the present invention, the following measures are adopted with regard to the aforementioned problems (1) to (3).

First, the problem (1) relative to turn-on of the parasitic diode is solved by providing the second P-channel transistor whose back gate is connected to the pad as described in (1-1).

Regarding the next problem (2) that the P-channel transistor in the final output stage fails to be completely turned off, the third P-channel transistor described in (1-4) is provided to serve as a pull-up transistor for pulling up the gate of the second P-channel transistor, so that 5 V applied to the pad is further applied via the third P-channel transistor to the gate of the second P-channel transistor, which is thereby turned off completely.

Further, in regard of the problem (3) that a high electric field is induced due to the application of a high voltage such as 5 V to the N-channel transistor, the provision of the first N-channel transistor described in (1-2) is effective to disperse the applied high voltage to the first N-channel transistor and the second N-channel transistor, thereby preventing generation of any high electric field that exceeds the withstand voltage of one N-channel transistor.

Meanwhile, in the input buffer circuit of the present invention, the following measure is adopted to solve the problem (3).

Since the fifth N-channel transistor described in (2-2) is additionally provided, the high voltage is dispersed to the fifth N-channel transistor and the inverter described in (2-1) so that generation of any high electric field exceeding the withstand voltage thereof is prevented. In addition, the feedback circuit described in (2-3) serves to raise the input voltage of the inverter to the regular value to consequently ensure a proper operation of the inverter.

Further, an output buffer circuit for outputting an "H" level, an "L" level or a high impedance to a pad via which a signal is transferred from or to an external circuit, comprises:

a plurality of pull-up transistors connected in series to each other between a power source and the pad, wherein a first signal is inputted to a gate of the pull-up transistor disposed proximate to the power source, and a back gate of the pull-up transistor disposed proximate to the pad is connected to the pad;

a plurality of pull-down transistors connected in series to each other between the pad and a ground, wherein a second signal is inputted to a gate of the pull-down transistor disposed proximate to the ground;

an enable transistor and a control transistor connected in series to each other between gates of the plurality of pull-up transistors, wherein an enable signal is inputted to a gate of the enable transistor, and a third signal having an inverse logic with respect to the second signal is inputted to a gate of the control transistor; and a gate pull-up transistor disposed between the control transistor and the pad.

Furthermore, the third signal is inputted to a gate of the gate pull-up transistor.

Further, a gate of the gate pull-up transistor is connected to the power source.

Furthermore, a gate of the pull-down transistor disposed proximate to the pad is connected to the power source.

Further, the first signal is inputted to a gate of the pull-down transistor disposed proximate to the pad.

Furthermore, a mutual junction of the plurality of pull-up transistors is connected to a mutual junction of the plurality of pull-down transistors.

Further, a back gate of the pull-up transistor disposed proximate to the power source is connected thereto.

Thus, according to the present invention, improvements are attained in the output buffer circuit, the input buffer circuit and the bi-directional buffer circuit producible without the necessity of any change or addition of the processing steps, wherein merely a single power source is required and still the entire problems (1) to (3) mentioned with reference to FIG. 10 are completely solved.

Further, in case of the live disconnection, when "H" is inputted to the pad 11 under the condition that power supply is cut down (off) and only signal pins are connected, no current flows within the transistors 101 and 102. Because, the back gate of the transistor 102 is connected to the pad 11 by the transistor 108 being "ON" state so that the parasitic diode 12a is not forward direction and it does not turned on. Further, gate of the transistor 102 is charged to a potential of the pad 11 by the transistor 108 so that the transistor 102 is made to be completely "OFF" state.

In other word, the case of the live disconnection can be regarded as extreme case (internal voltage=0 V, external voltage=5 V) of plural voltage system.

These and other objects, features and advantages of the present invention will become more apparent upon a reading of the following description and appended drawings.

BRIEF DESCRIPTION OF THE DRAWINGS

The preferred embodiments will be described with reference to the drawings, wherein like elements have been denoted throughout the figures with like reference numerals, and wherein.

DESCRIPTION OF THE PREFERRED EMBODIMENTS

Hereinafter the preferred embodiments of the present invention will now be described in detail with reference to the accompanying drawings.

Figure 1:
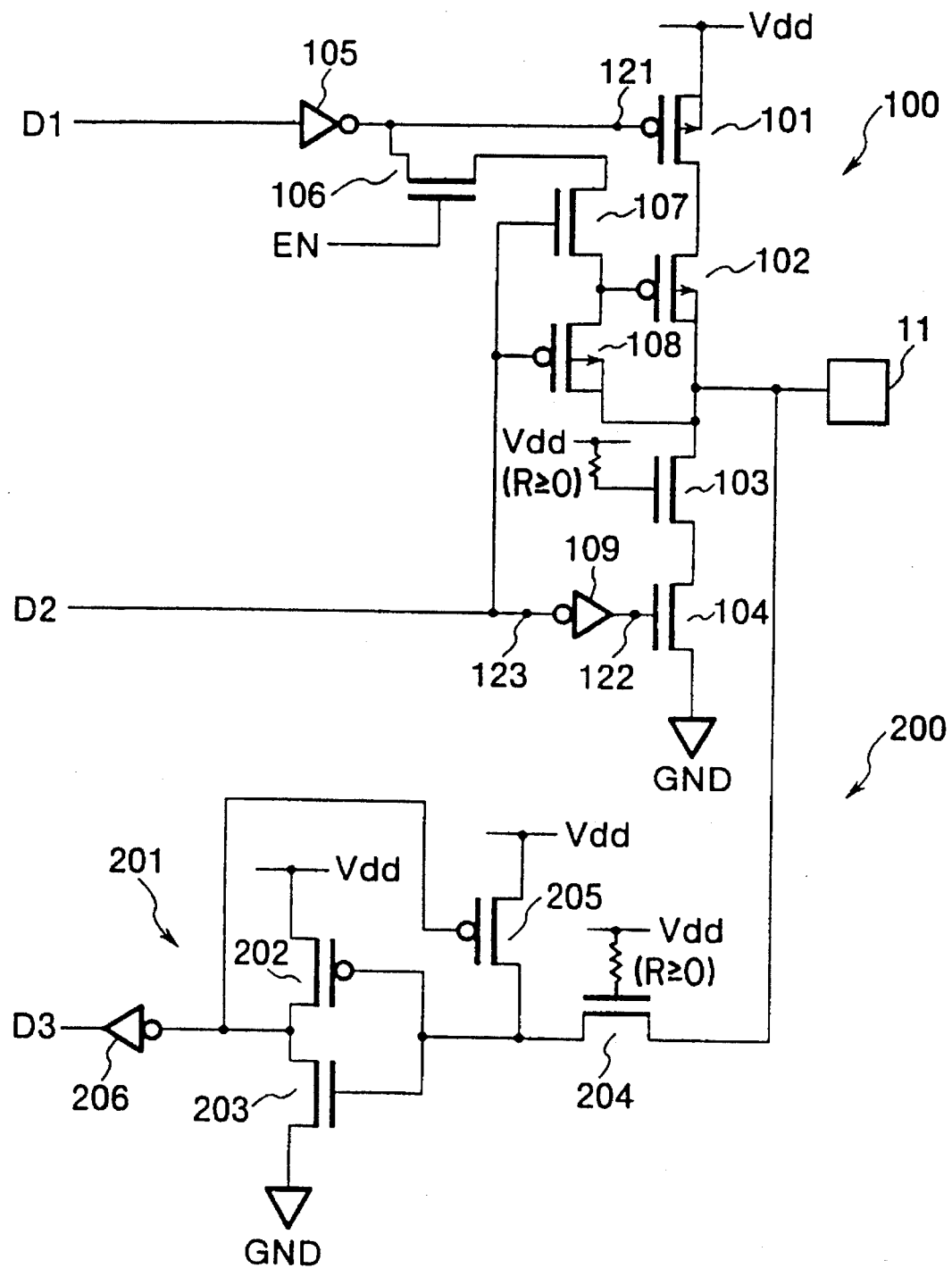
FIG. 1 is a circuit diagram showing a first embodiment of the bi-directional buffer circuit according to the present invention.

FIG. 1 is a circuit diagram of a first embodiment which represents the bi-directional buffer circuit according to the present invention.

An output buffer circuit 100 constituting the bi-directional buffer circuit of FIG. 1 serves for outputting an "H" level, an "L" level or a high impedance to a pad 11. In the output buffer circuit 100, there is a successive series connection of a first P-channel transistor 101 and a second P-channel transistor 102 between a 3 V power source Vdd and the pad 11 in this order, wherein a back gate of the first P-channel transistor 101 is connected to the power source Vdd while a back gate of the second P-channel transistor 102 is connected to the pad 11. Also in the output buffer circuit 100, there is a successive series connection of a first N-channel transistor 103 and a second N-channel transistor 104 between the pad 11 and a ground GND in this order. As shown in FIG. 1, a gate of the first N-channel transistor 103 may be connected to the power source Vdd via an impedance element.

A gate of the first P-channel transistor 101 is connected to an output terminal of a first inverter 105, and a signal D1 is inputted to the first inverter 105. In this embodiment, an output terminal 121 of the first inverter 105, i.e., a gate terminal of the first P-channel transistor 101, corresponds to a first signal input terminal in the present invention, and therefore the signal D1 is the one obtained by inverting the logic of the first signal defined in this invention.

The gate of the second P-channel transistor 102 is connected to an output terminal 121 of the first inverter 105 via a third N-channel transistor 106 and a fourth N-channel transistor 107 which are connected in series between the output terminal 121 of the first inverter 105 and the gate of the second P-channel transistor 102. Further a third P-channel transistor 108, whose back gate is connected to the pad 11, is connected between the gate of the second P-channel transistor 102 and the pad 11.

An enable signal EN is inputted to the gate of the third N-channel transistor 106. In this embodiment, the gate terminal of the third N-channel transistor 106 corresponds to an enable signal input terminal.

A gate of the fourth N-channel transistor 107 and a gate of the third P-channel transistor 108 are both connected to an input terminal 123 of a second inverter 109. And a signal D2 is inputted to the second inverter 109.

A gate of the first N-channel transistor 103 is connected to the power source Vdd, while a gate of the second N-channel transistor 104 is connected to an output terminal 122 of the second inverter 109. In this embodiment, the output terminal 122 of the second inverter 109, i.e., the gate terminal of the second N-channel transistor 104, corresponds to a second signal input terminal defined in this invention; and the input terminal 123 of the second inverter 109, i.e., each gate terminal of the fourth N-channel transistor 107 and the third P-channel transistor 108, corresponds to a third signal input terminal defined in this invention. Therefore the signal D2 corresponds to the third signal defined in the present invention, and the signal obtained by inverting the third signal in the second inverter 109 corresponds to the second signal defined in the present invention.

An input buffer circuit 200 constituting the bi-directional buffer circuit of FIG. 1 comprises an inverter 201 which consists of a pair of P-channel transistor 202 and N-channel transistor 203 connected in series between a power source Vdd and a ground GND, a fifth N-channel transistor 204 disposed between the pad 11 and an input terminal of the inverter 201 with its gate connected to the power source Vdd, a feedback P-channel transistor 205 disposed between the power source Vdd and the input terminal of the inverter 201 with its gate connected to an output terminal of the inverter 201, and a third inverter 206 whose input terminal is connected to the output terminal of the inverter 201. As shown in FIG. 1, the gate of the fifth N-channel transistor 204 may be connected to the power source Vdd via an impedance element.

Figure 2:
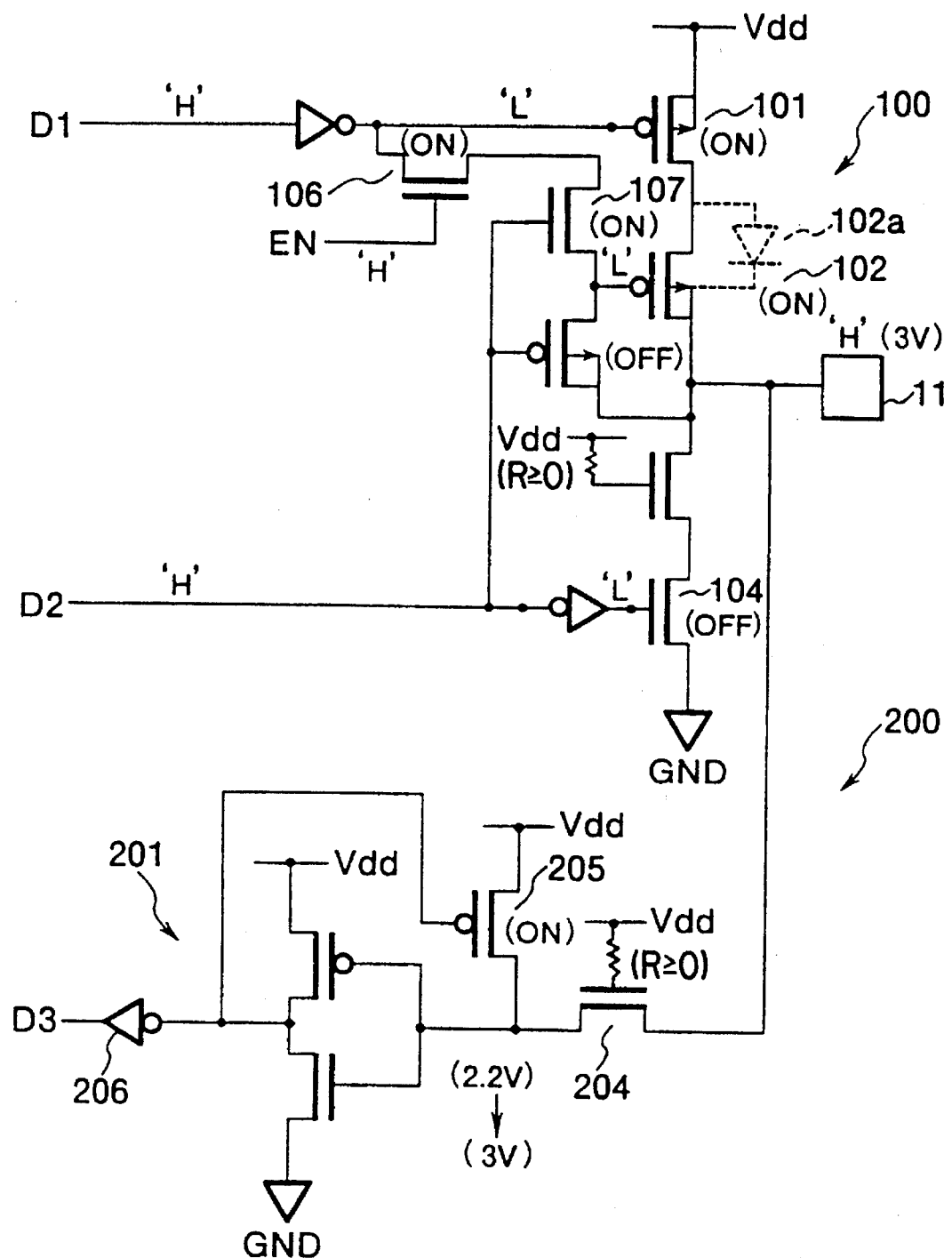
FIG. 2 is a circuit diagram similar to FIG. 1, showing the states of individual elements when an "H" (high) level (3 V) signal is outputted to a pad.

FIG. 2 is a circuit diagram similar to FIG. 1, showing the states of individual elements when an "H" level (3 V) signal is outputted to the pad 11.

In outputting an "H" level to the pad 11, both of the signals D1 and D2 are transited to an "H" level, while the enable signal EN is held at an "H" level.

When the signals D1 and D2 are transited to an "H" level in the state where the enable signal EN is held at an "H" level, an "L" level is applied to the gate of the first P-channel transistor 101, so that the first P-channel transistor 101 is turned on and then a parasitic diode 102a of the second P-channel transistor 102 is bulk-charged to thereby start transition of the pad 11 to an "H" level.

Since the third N-channel transistor 106 and the fourth N-channel transistor 107 are both turned on, the second P-channel transistor 102 is also turned on thereafter, whereby an "H" level is outputted to the pad 11 via the first P-channel transistor 101 and the second P-channel transistor 102. And simultaneously an "L" level is applied to the gate of the second N-channel transistor 104 to thereby turn off the same.

In this stage of the operation, an "H" level is applied to the input buffer circuit 200 as well, and due to the application of 3 V from the power source Vdd to the gate of the fifth N-channel transistor 204, the input terminal of the inverter 201 receives a voltage (Vdd–Vth) which is lower than the source voltage Vdd by a threshold voltage Vth, e.g., 2.2 V when Vth=0.8 V. Consequently the potential at the output terminal of the inverter 201 is lowered to thereby turn on the P-channel transistor 205, so that the source voltage Vdd=3 V is applied via the P-channel transistor 205 to the input terminal of the inverter 201. As a result, the output terminal of the inverter 201 is completely turned to an "L" level, and this signal is supplied via the third inverter 206, which then transits the signal D3 to an "H" level. The above operation is performed in the input buffer circuit 200 in response to the "H" level output to the pad 11, but normally the signal D3 is not used at the time of outputting the signal from the output buffer circuit 100 to the pad 11.

As described, the bi-directional buffer circuit of this embodiment performs a satisfactory operation without any problem when outputting an "H" level signal to the pad 11.

Figure 3:
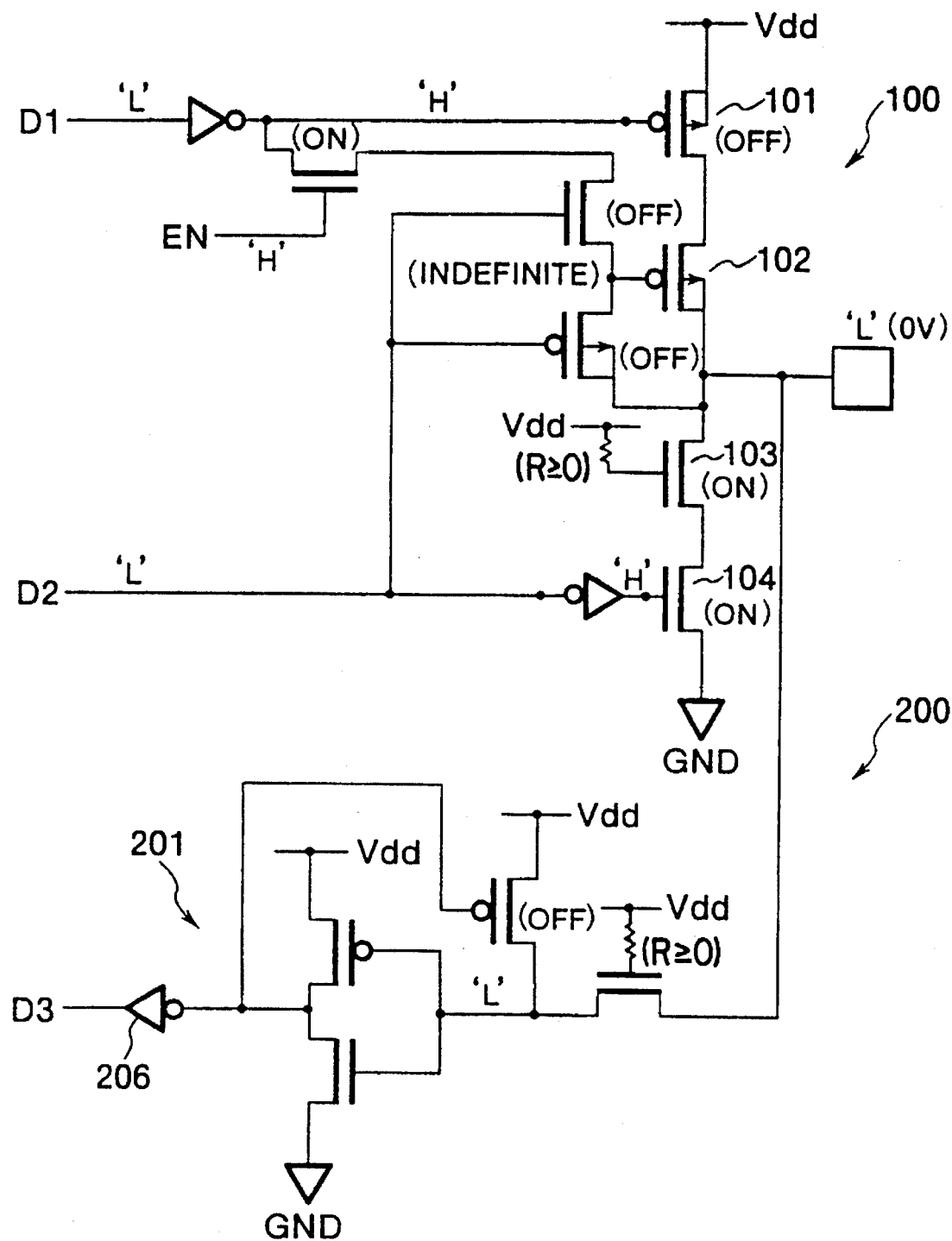
FIG. 3 is a circuit diagram similar to FIG. 1, showing the states of the individual elements when an "L" (low) level (0 V) signal is outputted to the pad.

FIG. 3 is a circuit diagram similar to FIG. 1, showing the states of the individual elements when an "L" level (0 V) signal is outputted to the pad 11.

In outputting an "L" level to the pad 11, both of the signals D1 and D2 are transited to an "L" level. Meanwhile the enable signal EN is still held at an "H" level at this time as well.

When the signals D1 and D2 have both been transited to an "L" level in the state where the enable signal EN is held at an "H" level, the second N-channel transistor 104 is turned on. Since the first N-channel transistor 103 is also in its on-state at this time, the pad 11 and the ground GND are connected to each other via the first and second N-channel transistors 103 and 104, whereby an "L" level (0 V) is outputted to the pad 11.

In this stage of the operation, an "H" level is applied to the gate of the first P-channel transistor 101 to consequently turn off the same, whereby the gate potential of the second P-channel transistor 102 is rendered indefinite. However, as its back gate is connected to the pad 11, the potential is changed to 0 V so that the second P-channel transistor 102 is also turned off.

And simultaneously, an "L" level is applied to the input terminal of the inverter 201 in the input buffer circuit 200, thereby turning the output terminal of the inverter 201 to an "H" level while turning the output signal D3 of the third inverter to an "L" level.

Thus, the bi-directional buffer circuit of this embodiment performs a satisfactory operation without any problem also when outputting an "L" level signal to the pad 11.

Figure 4:
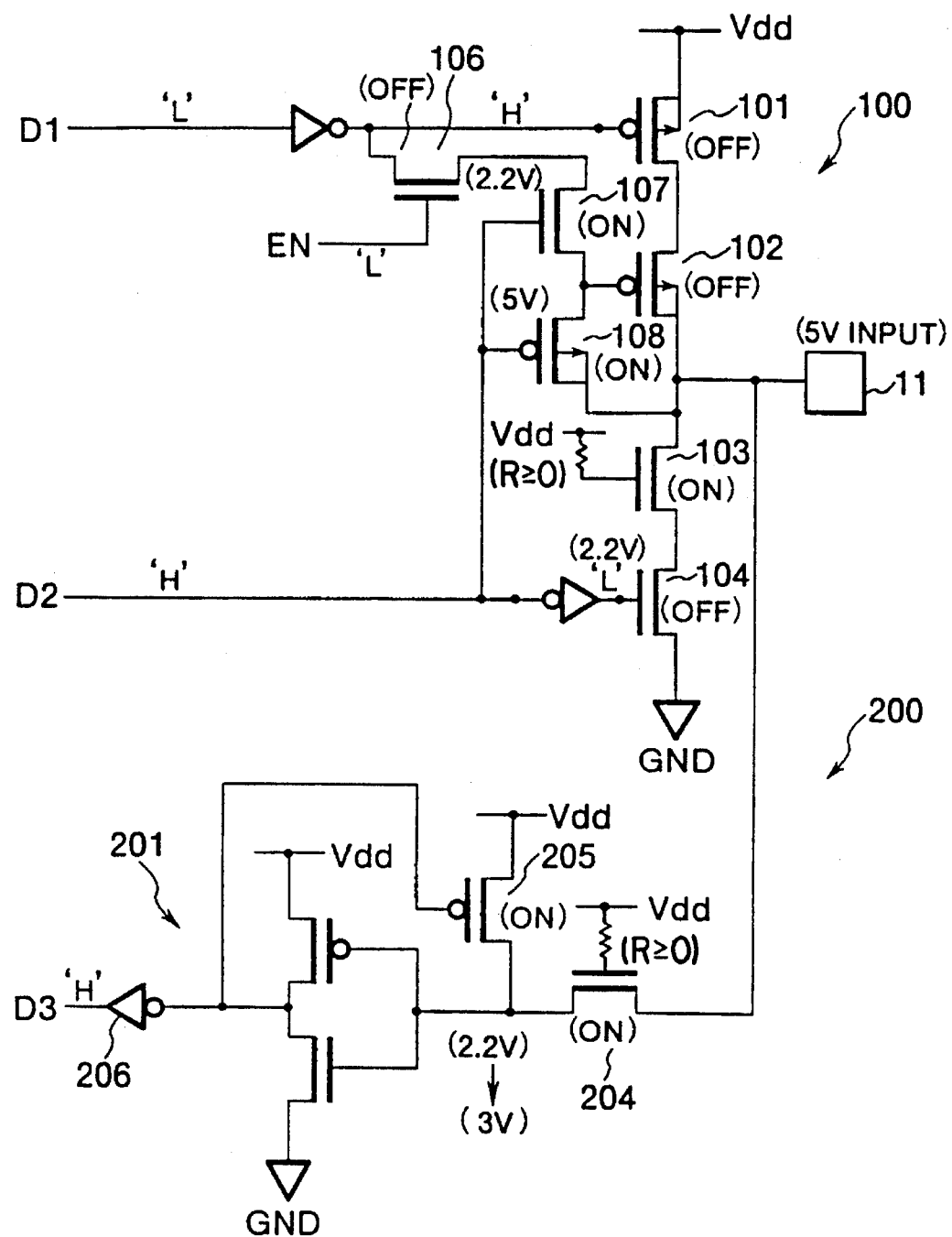
FIG. 4 is a circuit diagram similar to FIG. 1, showing the state where a high impedance is outputted to the pad from the output buffer circuit and an "H" level (5 V) is applied to the pad from an external circuit.

FIG. 4 is a circuit diagram similar to FIG. 1, showing the state where a high impedance is outputted from the output buffer circuit 100 to the pad 11 and an "H" level (5 V) is applied from an external circuit to the pad 11.

In this stage of the operation, an "L" level is inputted as the enable signal EN, while an "L" level and an "H" level are inputted as the signals D1 and D2 respectively.

At this time, an "H" level is applied to the gate of the first P-channel transistor 101, which is thereby turned off. And simultaneously therewith, 3 V of the signal D2 is applied to the gate of the third P-channel transistor 108 while 5 V of the pad 11 is applied to the back gate thereof, so that a current denoted by reference numeral (2) in FIG. 10 flows in the third P-channel transistor 108 to thereby cause application of 5 V to the gate of the second P-channel transistor 102. Consequently the second P-channel transistor 102 is placed completely in its off-state. In this stage of the operation, the fourth N-channel transistor 107 is in its on-state as an "H"

level (3 V) of the signal D2 is applied to the gate thereof, but since it is an N-channel transistor, the potential at the junction of the third N-channel transistor 106 and the fourth N-channel transistor 107 is 2.2 V for example, so that any high electric field exceeding the withstand voltage is not generated in the fourth N-channel transistor 107 either. Further the potential difference between the source and the drain of the third N-channel transistor 106 is suppressed to be as low as 0.8 V.

Since an "L" level is applied simultaneously therewith to the gate of the second N-channel transistor 104, this transistor 104 is turned off and then 5 V applied to the pad 11 is divided to the first N-channel transistor 103 and the second N-channel transistor 104, so that any high electric field exceeding the withstand voltage is not generated in the first N-channel transistor 103 or the second N-channel transistor 104 either.

A voltage of 5 V applied to the pad 11 is subsequently applied to the fifth N-channel transistor 204 in the state where 3 V is being applied to the gate of this transistor 204, so that 2.2 V is applied to the input terminal of the inverter 201. As a result, merely 2.8 V is applied between the source and the drain of the fifth N-channel transistor 204, and consequently any high electric field exceeding the withstand voltage is not generated therein.

Subsequently, as mentioned, 3 V is applied to the input terminal of the inverter 201 via the feedback P-channel transistor 205, and then the output of the inverter 201 is turned to an "L" level while the output signal D3 of the third inverter 206 is turned to an "H" level, and thereafter the "H"-level signal D3 thus obtained is fed to the inside.

Figure 10:
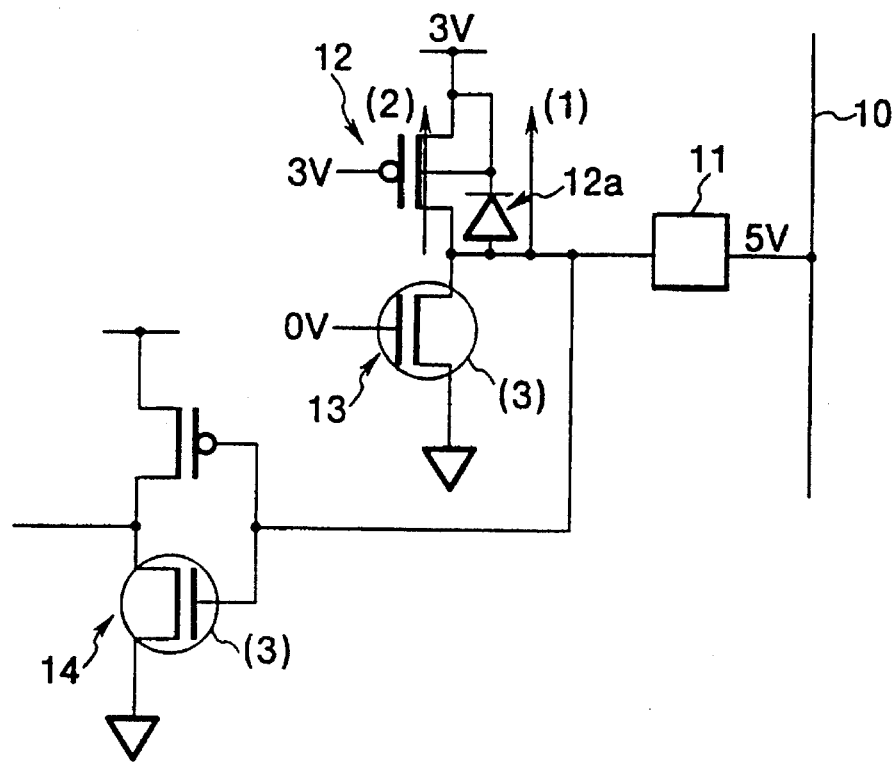
FIG. 10 is a circuit diagram showing a conventional bi-directional buffer circuit of the prior art enclosed with a circle in FIG. 9.
Figure 11:
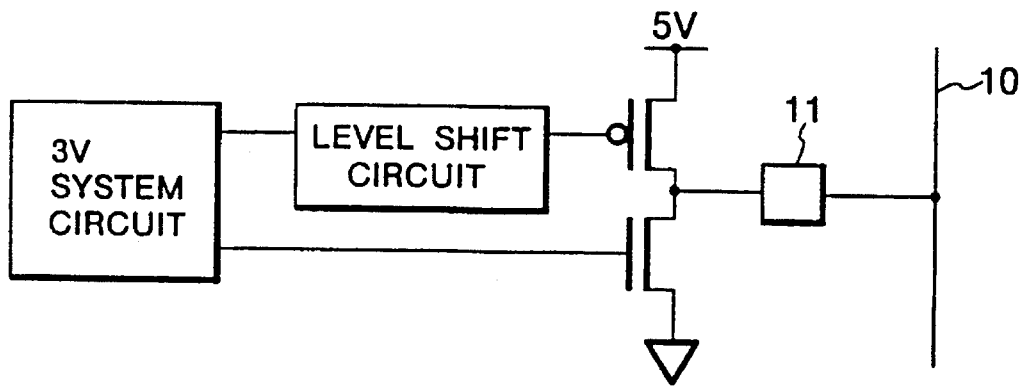
FIG. 11 typically shows the known measures adopted in the prior art.

As described above, when a high impedance is outputted from the output buffer circuit 100 in this manner and 5 V is applied to the pad 11 from an external circuit, there arises none of the problems (1) to (3) described with reference to FIG. 10, and the 5 V "H"-level signal applied to the pad 11 is converted to a 3 V "H"-level signal and then is fed to the inside.

Figure 5:
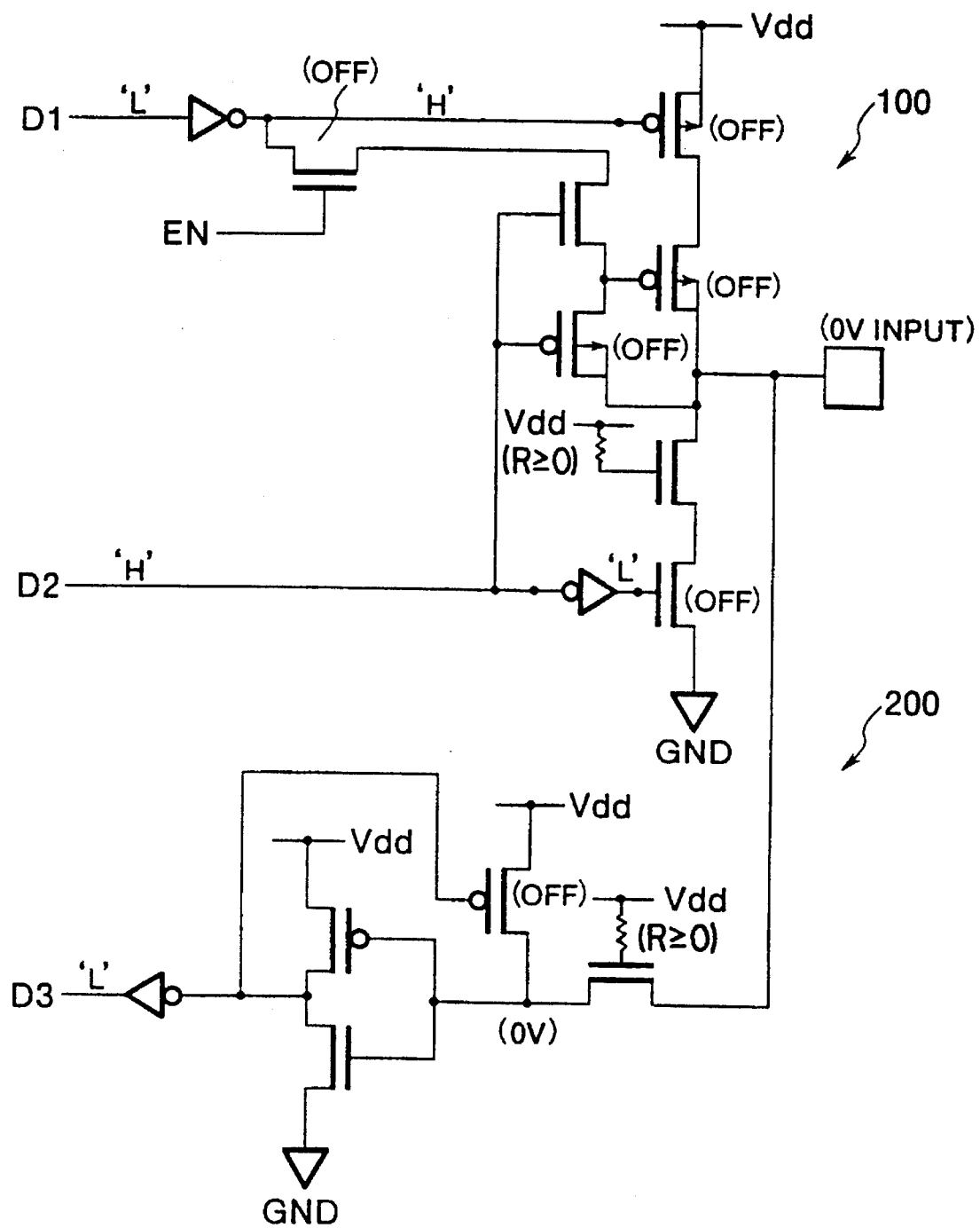
FIG. 5 is a circuit diagram similar to FIG. 1, showing the state where a high impedance is outputted to the pad from the output buffer circuit and an "L" level (0 V) is applied to the pad from the external circuit.

FIG. 5 is a circuit diagram similar to FIG. 1, showing the state where a high impedance is outputted from the output buffer circuit 100 to the pad 11 and an "L" level (0 V) is applied from the external circuit to the pad 11.

In this case, each transistor operates in such a manner as shown in FIG. 5, and the "L"-level signal (0 V) applied to the pad 11 is fed to the inside without causing any of the problems (1) to (3) described with reference to FIG. 10.

Thus, according to the embodiment shown in FIG. 1, an improved bi-directional buffer circuit can be realized without the necessity of any modification or addition in the processing steps, wherein merely a single 3 V power source is incorporated and application of an external voltage of 5 V is permitted.

In this embodiment, the back gate (substrate) of the first P-channel transistor 101, which serves as a power supply side pull-up transistor with its source electrode connected to the power source Vdd, is connected directly to the power source Vdd, and the second P-channel transistor 102 is existent between the first P-channel transistor 101 and the pad 11, so that it becomes possible to prevent occurrence of a latch-up trouble.

Figure 6:
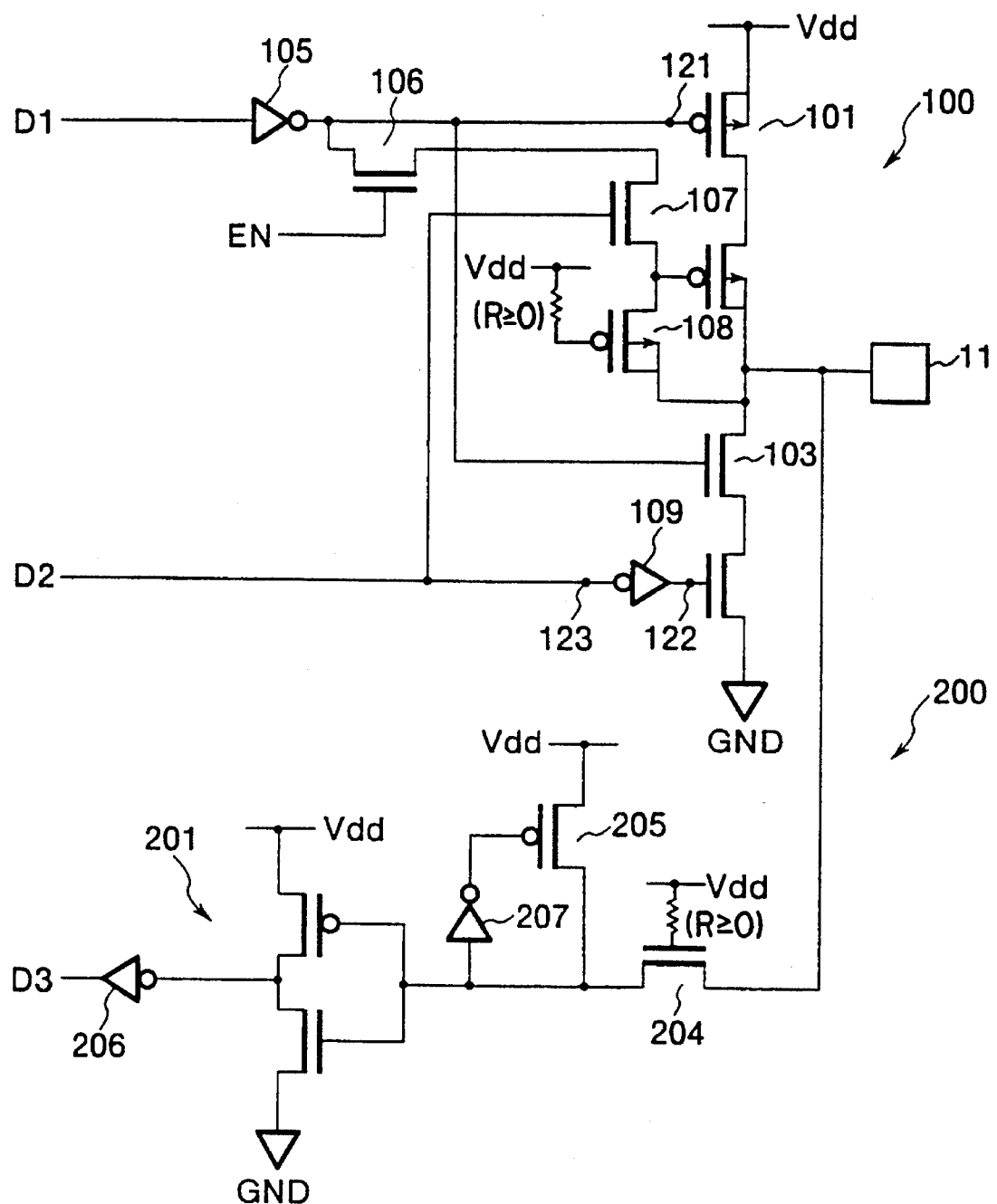
FIG. 6 is a circuit diagram showing a second embodiment of the bi-directional buffer circuit according to the present invention.

FIG. 6 is a circuit diagram of a second embodiment which represents the bi-directional buffer circuit of the present invention. A description will now be given below only on the difference from the aforementioned first embodiment shown in FIG. 1.

A gate of a first N-channel transistor 103 in the second embodiment is connected to an output terminal 121 (first signal input terminal) of a first inverter 105. Meanwhile a gate of a fourth N-channel transistor 107 is connected to an input terminal 123 of a second inverter 109, and a gate of a third P-channel transistor 108 is connected to a power source Vdd. The connection of each gate of such first N-channel transistor 103 and third P-channel transistor 108 constituting an output buffer circuit 100 may be changed individually as shown in FIG. 1 or FIG. 6.

A gate of a feedback P-channel transistor 205 in an input buffer circuit 200 of the second embodiment is connected to an output terminal of an inverter 207, and an input terminal of the inverter 207 is connected to an input terminal of an inverter 201. In this manner, the feedback circuit for raising the input terminal potential of the inverter 201 from 2.2 V to 3 V may be formed into a variety of configurations without being limited to the aforementioned example alone.

Figure 7:
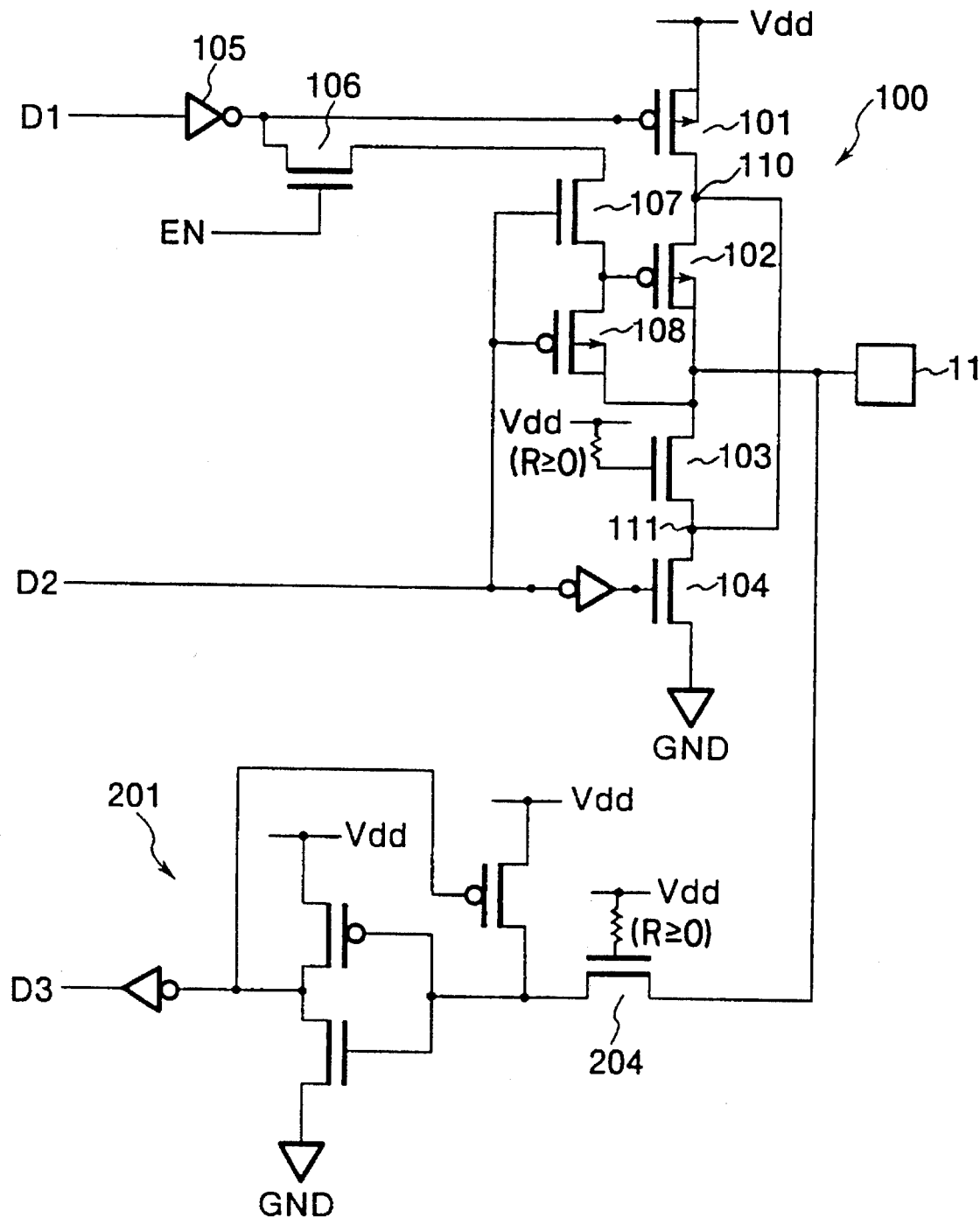
FIG. 7 is a circuit diagram showing a third embodiment of the bi-directional buffer circuit according to the present invention.

FIG. 7 is a circuit diagram of a third embodiment which represents the bi-directional buffer circuit of the present invention. A description will now be given below only on the difference from the aforementioned first embodiment shown in FIG. 1.

In the third embodiment of FIG. 7, a junction 110 of a first P-channel transistor 101 and a second P-channel transistor 102 is connected to a junction 111 of a first N-channel transistor 103 and a second N-channel transistor 104.

Figure 8:
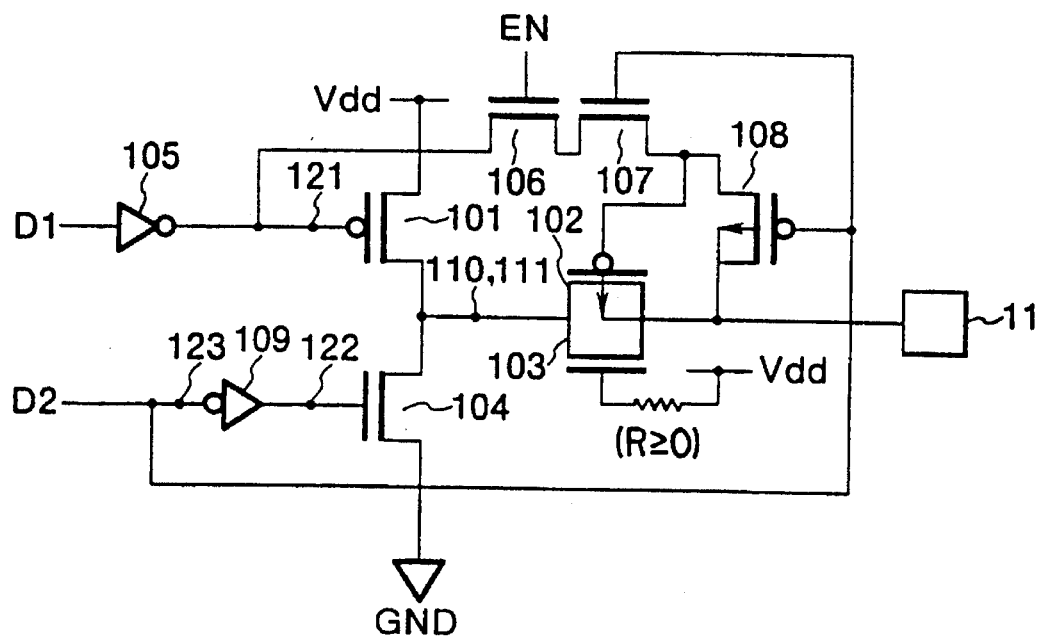
FIG. 8 is a circuit diagram similar to the third embodiment of FIG. 7 rewritten with partial modification of its output buffer circuit.
Figure 9:
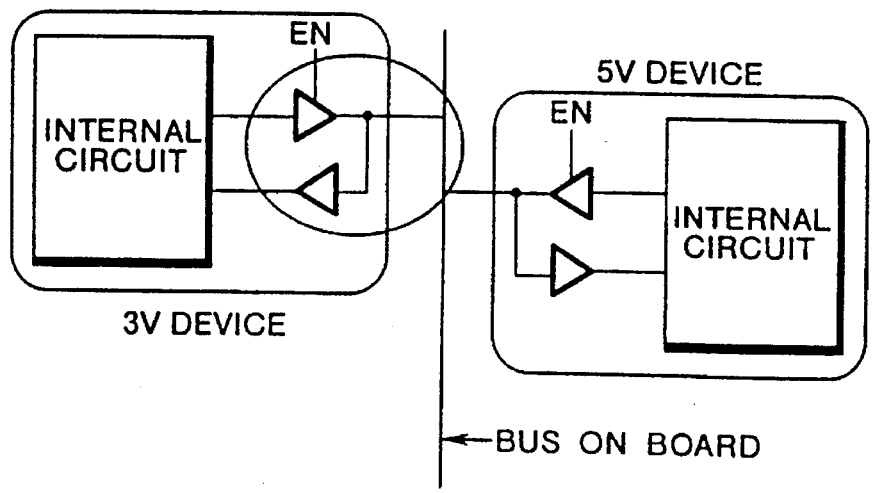
FIG. 9 typically shows how a 3 V-operated device and a 5 V-operated device are coexistent with mutual connection to a common bus on a board.

FIG. 8 is a circuit diagram similar to the third embodiment of FIG. 7 rewritten with partial modification of its output buffer circuit.

Due to the mutual connection of the two junctions 110 and 111, the second P-channel transistor 102 and the first N-channel transistor 103 are connected in parallel to each other as shown in FIG. 8. It may be possible in both of the first and second embodiments as well to drive fast an external load connected to the pad 11 by turning on the parasitic diode at the time of a level transition. Meanwhile, in the third embodiment where the second P-channel transistor 102 and the first N-channel transistor 103 are in parallel connection, a greater current is permitted to flow in comparison with the first and second embodiments when the signal of the pad 11 is changed from an "L" level to an "H" level or from an "H" level to an "L" level, whereby the external load can be driven at a higher speed.

Although each of the above-described embodiments represents a bi-directional buffer circuit including both the output buffer circuit 100 and the input buffer circuit 200, it is to be noted that the configuration may be composed merely of the output buffer circuit 100 or the input buffer circuit 200 alone.

Having now fully described the invention, it will be apparent to one of ordinary skill in the art that many changes and modifications can be made thereto without departing from the spirit and scope of the invention as set forth herein.

What is claimed is:

1. An output buffer circuit for outputting a signal to a pad via which the signal is transferred to an external circuit, comprising:

first and second pull-up transistors connected in series between a power source and said pad, wherein a first signal is inputted to a gate of the first pull-up transistor disposed proximate to said power source, and a back gate of the second pull-up transistor disposed proximate to said pad is connected to said pad; and a gate pull-up transistor for pulling up a gate of said second pull-up transistor.

2. The output buffer circuit according to claim 1, wherein said pad is connected to a connector which may be disconnected without cutting power supply.

3. An output buffer circuit for outputting an "H" (high) level, an "L" (low) level or a high impedance to a pad via which a signal is transferred from or to an external circuit, comprising:

a successive series connection of a first P-channel transistor and a second P-channel transistor between a power source and said pad in this order, wherein a back gate of said first P-channel transistor is connected to said power source and a gate thereof is connected to a first signal input terminal to which a first signal is inputted, the first signal being transited to an "L" level at the time of outputting an "H" level to said pad, or transited to an "H" level at the time of outputting an "L" level or a high impedance to said pad, and a back gate of said second P-channel transistor is connected to said pad;

a successive series connection of a first N-channel transistor and a second N-channel transistor between said pad and a ground in this order, wherein a gate of said first N-channel transistor is connected to said power source or said first signal input terminal, and a gate of said second N-channel transistor is connected to a second signal input terminal to which a second signal is inputted, said second signal being transited to an "L" level at the time of outputting an "H" level or a high impedance to said pad, or transited to an "H" level at the time of outputting an "L" level to said pad;

a successive series connection of a third N-channel transistor and a fourth N-channel transistor between said first signal input terminal and the gate of said second P-channel transistor in this order, wherein a gate of said third N-channel transistor is connected to an enable signal input terminal to which an enable signal is inputted, said enable signal being transited to an "H" level at the time of outputting an "H" level or an "L" level to said pad or transited to an "L" level at the time of outputting a high impedance to said pad, and a gate of said fourth N-channel transistor is connected to a third signal input terminal to which a third signal is inputted, said third signal having an inverted logic with respect to said second signal; and a third P-channel transistor connected between said pad and the gate of said second P-channel transistor, wherein a back gate of said third P-channel transistor is connected to said pad, and a gate thereof is connected to either said power source or said third signal input terminal.

4. The output buffer circuit according to claim 3, wherein the gate of the first N-channel transistor is connected to said power source via an impedance element.

5. The output buffer circuit according to claim 3, wherein a junction of said first P-channel transistor and said second P-channel transistor is connected to a junction of said first N-channel transistor and said second N-channel transistor, whereby said second P-channel transistor and said first N-channel transistor are connected in parallel to each other.

6. An input buffer circuit for feeding to an internal circuit an "H" level or an "L" level inputted to a pad via which a signal is transferred from or to an external circuit, comprising:

an inverter;

an N-channel transistor disposed between said pad and an input terminal of said inverter with its gate connected to a power source; and a feedback circuit for raising the input terminal potential of said inverter to the power source potential when an "H" level is inputted to said pad.

7. The input buffer circuit according to claim 6, wherein a gate of the N-channel transistor is connected via an impedance element to said power source.

8. The input buffer circuit according to claim 6, wherein said feedback circuit includes a feedback P-channel transistor disposed between said power source and the input terminal of said inverter.

9. The input buffer circuit according to claim 8, wherein a gate of said feedback P-channel transistor is connected to an output terminal of said inverter.

10. The input buffer circuit according to claim 8, wherein a gate of said feedback P-channel transistor is connected to an output terminal of an inverter which is independent of said inverter, and an input terminal of said latter inverter is connected to an input terminal of said former inverter.

11. A bi-directional buffer circuit including:

an output buffer circuit comprising an output buffer circuit for outputting an "H" (high) level, an "L" (low) level or a high impedance to a pad via which a signal is transferred from or to an external circuit, comprising:

a successive series connection of a first P-channel transistor and a second P-channel transistor between a power source and said pad in this order, wherein a back gate of said first P-channel transistor is connected to a first signal input terminal to which a first signal is inputted, the first signal being transited to an "L" level at the time of outputting an "H" level to said pad, or transited to an "H" level at the time of outputting an "L" level or a high impedance to said pad, and a back gate of said second P-channel transistor is connected to said pad;

a successive series connection of a first N-channel transistor and a second N-channel transistor between said pad and a ground in this order, wherein a gate of said first N-channel transistor is connected to said power source or said first signal input terminal, and a gate of said second N-channel transistor is connected to a second signal input terminal to which a second signal is inputted, said second signal being transited to an "L" level at the time of outputting an "H" level or a high impedance to said pad, or transited to an "H" level at the time of outputting an "L" level to said pad;

a successive series connection of a third N-channel transistor and a fourth N-channel transistor between said first signal input terminal and the gate if said second P-channel transistor in this order, wherein a gate of said third N-channel transistor is connected to an enable signal input terminal to which an enable signal is inputted, said enable signal being transited to an "H" level at the time of outputting an "H" level or an "L" level to said pad or transited to an "L" level at the time of outputting a high impedance to said pad, and a gate of said fourth N-channel transistor is connected to a third signal input terminal to which a third signal is inputted, said third signal having an inverted logic with respect to said second signal; and a third P-channel transistor connected between said pad and the gate of said second P-channel transistor, wherein a back gate of said third P-channel transistor is connected to said pad, and a gate thereof is connected to either said power source or said third signal input terminal and an input buffer circuit comprising an input buffer circuit for feeding to an internal circuit an "H" level or an "L" level inputted to a pad via which a signal is transferred from or to an external circuit, comprising:

an inverter;

a fifth N-channel transistor disposed between said pad and an input terminal of said inverter with its gate connected to a power source; and a feedback circuit for raising the input terminal potential of said inverter to the power source potential when an "H" level is inputted to said pad, wherein said output buffer circuit and said input buffer circuit are both connected to the same pad.

12. An output buffer circuit for outputting an "H" level, an "L" level or a high impedance to a pad via which a signal is transferred from or to an external circuit, comprising:

a plurality of pull-up transistors connected in series to each other between a power source and said pad wherein a first signal is inputted to a gate of one of the plurality of pull-up transistors disposed proximate to said power source, and a back gate of one of the plurality of pull-up transistors disposed proximate to said pad is connected to said pad;

a plurality of pull-down transistors connected in series to each other between said pad and a ground, wherein a second signal is inputted to a gate of one of the plurality of pull-down transistors disposed proximate to said ground;

an enable transistor and a control transistor connected in series to each other between gates of said plurality of pull-up transistors, wherein an enable signal is inputted to a gate of said enable transistor, and a third signal having an inverse logic with respect to said second signal is inputted to a gate of said control transistor; and a gate pull-up transistor disposed between said control transistor and said pad.

13. The output buffer circuit according to claim 12, wherein said third signal is inputted to a gate of said gate pull-up transistor.

14. The output buffer circuit according to claim 12, wherein a gate of said gate pull-up transistor is connected to said power source.

15. The output buffer circuit according to claim 12, wherein a gate of the one of the plurality of pull-down transistors disposed proximate to said pad is connected to said power source.

16. The output buffer circuit according to claim 12, wherein said first signal is inputted to a gate of the one of the plurality of pull-down transistors disposed proximate to said pad.

17. The output buffer circuit according to claim 12, wherein a mutual junction of said plurality of pull-up transistors is connected to a mutual junction of said plurality of pull-down transistors.

18. The output buffer circuit according to claim 12, wherein a back gate of the one of the plurality of pull-up transistors disposed proximate to said power source is connected to said power source.

* * * * *